United States Patent
Mourrier et al.

(10) Patent No.: US 11,946,963 B2
(45) Date of Patent: Apr. 2, 2024

(54) RESISTANCE MEASUREMENT FOR MEASUREMENTS FROM MULTIPLE DEVICES

(71) Applicant: Infineon Technologies AG, Neubiberg (DE)

(72) Inventors: Andre Mourrier, Manosque (FR); Vincent Usseglio, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 17/809,686

(22) Filed: Jun. 29, 2022

(65) Prior Publication Data
US 2024/0003948 A1    Jan. 4, 2024

(51) Int. Cl.
*G01R 27/08* (2006.01)
*G01R 19/00* (2006.01)
*G01R 19/10* (2006.01)

(52) U.S. Cl.
CPC ........... *G01R 27/08* (2013.01); *G01R 19/003* (2013.01); *G01R 19/10* (2013.01)

(58) Field of Classification Search
CPC ..... G01R 19/0003; G01R 19/10; G01R 27/08
See application file for complete search history.

(56) References Cited

U.S. PATENT DOCUMENTS

| | | | | |
|---|---|---|---|---|
| 8,552,753 | B2 * | 10/2013 | Adkins | G01R 27/14 324/705 |
| 2020/0166547 | A1 * | 5/2020 | Kim | G01R 27/08 |
| 2020/0292623 | A1 * | 9/2020 | Jang | G01R 31/385 |
| 2021/0318368 | A1 * | 10/2021 | Lofthouse | H04L 12/10 |
| 2023/0155519 | A1 * | 5/2023 | Tawada | H02J 3/40 363/95 |

* cited by examiner

*Primary Examiner* — Thang X Le
(74) *Attorney, Agent, or Firm* — Shumaker & Sieffert, P.A.

(57) ABSTRACT

A controller circuit is configured to receive, from a first device, a first node voltage measured at a first node by the first device at a first time when a first current flows between the first node and a second node and receive, from a second device, a second node voltage measured at a second node by the second device at a second time when a second current flows between the first node and the second node, wherein the first time is different from the second time. The controller circuit is further configured to, responsive to a determination that the first current corresponds to the second current, calculate, using the first node voltage and the second node voltage, a resistance value for one or more electrical components electrically connecting the first node and the second node.

23 Claims, 12 Drawing Sheets

RESISTANCE MEASUREMENT FOR MEASUREMENTS FROM MULTIPLE DEVICES

TECHNICAL FIELD

This disclosure relates to techniques for measuring a resistance value of electrical components.

BACKGROUND

Monitoring systems can be used to detect a failure in a hardware component of a device. For example, a monitoring device may detect a resistance for anticipating a failure. In response to anticipating a failure, the monitoring device may be configured to output an alert to help to prevent failures in the device and to help to ensure safety to users of the device.

SUMMARY

In general, this disclosure is directed to techniques for ensuring safety in the operation of circuits of a device. For example, a circuit may include a power distribution circuit and actuator circuit that are connected using one or more electrical components (e.g., printed circuit board traces, wires, and/or connectors). In this example, a controller circuit may receive a first node voltage measured by a first device (e.g., a power distribution circuit) when a first current flows between the first node and a second node. The controller circuit may receive a second node voltage measured by a second device (e.g., an actuator) when a second current flows between the first node and a second node. The controller circuit may, responsive to a determination that the first current corresponds to (e.g., is about equal to or is exactly equal to) the second current, calculate, using the first node voltage and the second node voltage, a resistance value for one or more electrical components electrically connecting the first node and the second node. Using current to calculate the resistance value may help to avoid complex time-synchronization at the system level compared to systems that rely on synchronizing time for measuring the first voltage node voltage and the second voltage node voltage. In this way, systems configured to detect the failure using current may reduce a number of components used for protection compared to systems that rely on synchronizing time.

In one example, a controller circuit is configured to receive, from a first device, a first node voltage measured at a first node by the first device at a first time when a first current flows between the first node and a second node and receive, from a second device, a second node voltage measured at a second node by the second device at a second time when a second current flows between the first node and the second node, wherein the first time is different from the second time. The controller circuit is further configured to, responsive to a determination that the first current corresponds to the second current, calculate, using the first node voltage and the second node voltage, a resistance value for one or more electrical components electrically connecting the first node and the second node.

In another examples, a method comprising receiving, by a controller circuit, from a first device, a first node voltage at a first node measured by the first device at a first time when a first current flows between the first node and a second node and receiving by the controller circuit, from a second device, a second node voltage at a second node measured by the second device at a second time when a second current flows between the first node and the second node, wherein the first time is different from the second time. The method further comprises, responsive to determining that the first current corresponds to the second current, calculating, by the controller circuit, using the first node voltage and the second node voltage, a resistance value for one or more electrical components electrically connecting the first node and the second node.

In one example, a system comprising a first device configured to output a first node voltage measured at a first node by the first device at a first time when a first current flows between the first node and a second node and a second device configured to output a second node voltage measured at a second node by the second device at a second time when a second current flows between the first node and the second node, wherein the first time is different from the second time. The system further comprises a controller circuit configured to, responsive to a determination that the first current corresponds to the second current, calculate, using the first node voltage and the second node voltage, a resistance value for one or more electrical components electrically connecting the first node and the second node.

Details of these and other examples are set forth in the accompanying drawings and the description below. Other features, objects, and advantages will be apparent from the description and drawings, and from the claims.

DETAILED DESCRIPTION

Figure 1:
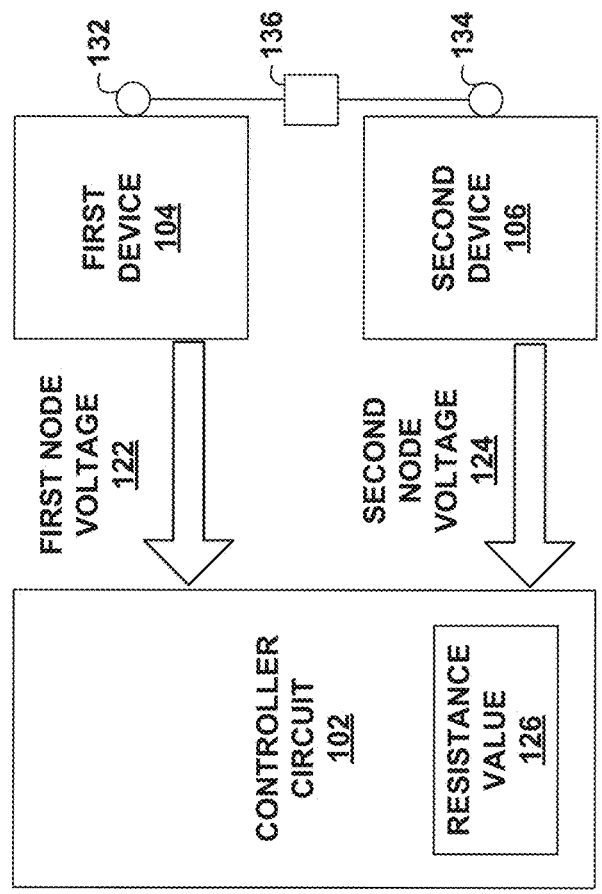
FIG. 1 is a block diagram illustrating an example system for calculating a resistance value, in accordance with one or more techniques of this disclosure.

FIG. 1 is a block diagram illustrating an example system 100 for calculating a resistance value 126, in accordance with one or more techniques of this disclosure. As illustrated in the example of FIG. 1, system 100 may include controller circuit 102, first device 104, and second device 106. First device 104 may include, for example, a power distribution circuit. In some examples, second device 106 may include, for example, an actuator circuit. As shown, first device 104 may be electrically coupled to a first node 132. Similarly, second device 106 may be electrically coupled to a second node 134. One or more electrical components 136 may electrically connect first node 132 to second node 134. One or more electrical components 136 may include, for example, one or more of: one or more printed circuit board traces, one or more wires, or one or more connectors.

Controller circuit 102 may be configured to receive, from a first device 104, a first node voltage 122. In this example, controller circuit 102 may be configured to receive, from a second device 106, a second node voltage 124. Controller circuit 102 may calculate, using first node voltage 122 and second node voltage 124, a resistance value 126. Controller circuit 102 may include an analog circuit. In some examples, controller circuit 102 may be a microcontroller on a single integrated circuit containing a processor core, memory, inputs, and outputs. For example, controller circuit 102 may include one or more processors, including one or more microprocessors, digital signal processors (DSPs), application specific integrated circuits (ASICs), field programmable gate arrays (FPGAs), or any other equivalent integrated or discrete logic circuitry, as well as any combinations of such components. The term "processor" or "processing circuitry" may generally refer to any of the foregoing logic circuitry, alone or in combination with other logic circuitry, or any other equivalent circuitry. In some examples, controller circuit 102 may be a combination of one or more analog components and one or more digital components.

In accordance with the techniques of the disclosure, controller circuit 102 may receive, from first device 104, a first node voltage 122 measured at first node 132 by first device 104 at a first time when a first current flows between first node 132 and second node 134. Controller circuit 102 may receive, from second device 106, second node voltage 124 measured at second node 134 by second device 106 at a second time when a second current flows between first node 132 and second node 134. The first time may be different from the second time. In this example, controller circuit 102 may, responsive to a determination that the first current corresponds to the second current, calculate, using first node voltage 122 and second node voltage 124, a resistance value 126 for one or more electrical components 136 electrically connecting first node 132 and second node 134.

Figure 2:
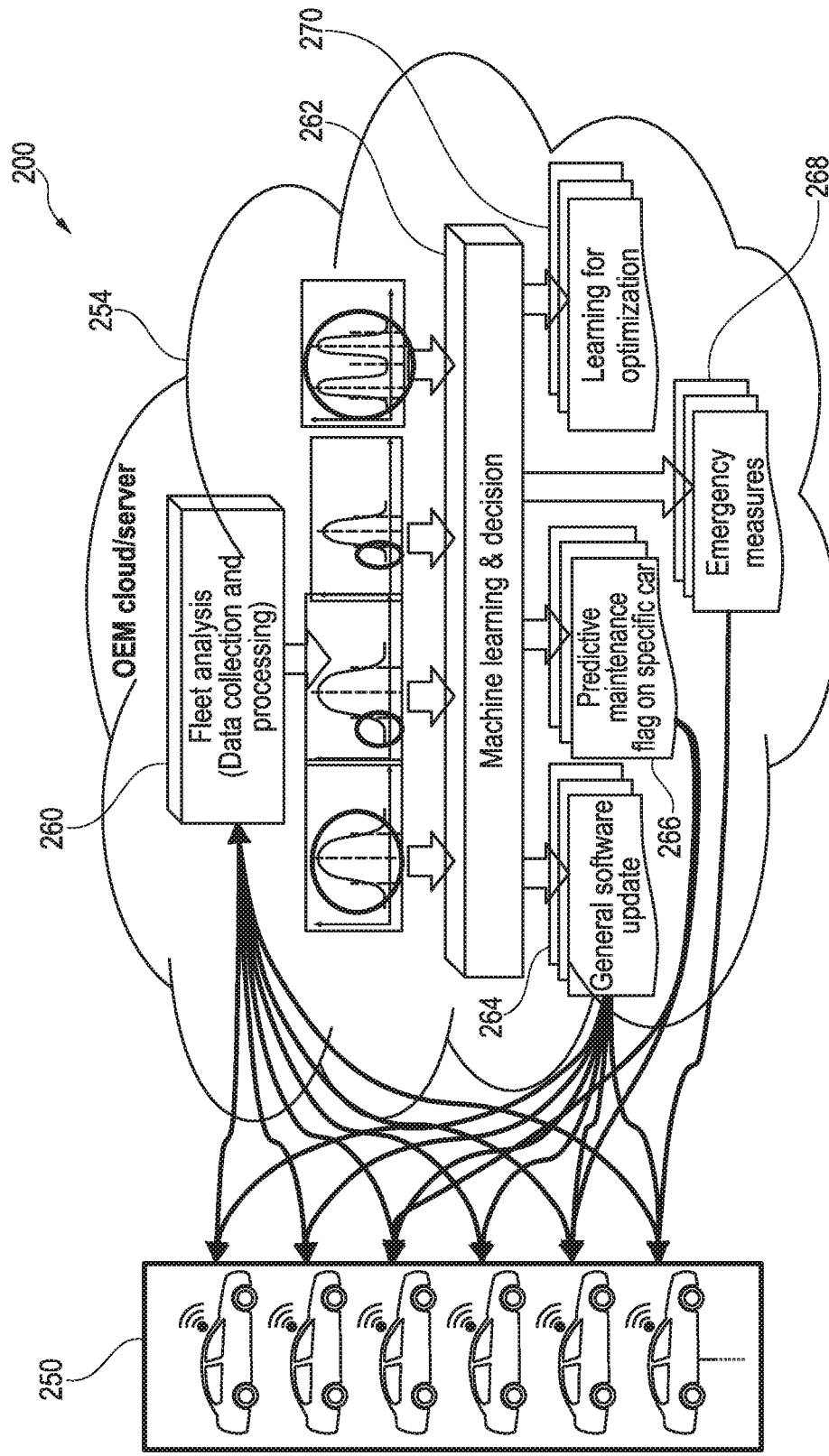
FIG. 2 is a conceptual diagram illustrating an example application for using a resistance value, in accordance with one or more techniques of this disclosure.

FIG. 2 is a conceptual diagram illustrating an example application for using a resistance value 126, in accordance with one or more techniques of this disclosure. The automated driving function of vehicles 250 may lead to an increase of complexity in the electrical/electronic (E/E) architecture. For supporting new car function, safety critical applications may benefit from being "fail operational." In addition, with the battery-electric vehicle (BEV), the lifetime of the vehicle of vehicles 250 may drastically increase so an anticipated detection of a potential fault may be helpful for increasing the vehicle availability.

Failure anticipation and predictive maintenance may be helpful for reducing the system cost of system 200. As shown, OEM cloud/server 254 may perform a fleet analysis 260 for data collection and processing and apply machine learning and decision 262 to generate one or more of: a general software update 264, a predictive maintenance flag on a specific car 266 (e.g., one of vehicles 202), an emergency measure 268, or a learning for optimization 270. In accordance with the techniques of the disclosure, OEM cloud/server 254 may check wire and connector resistance values for anticipating a power line failure. While FIG. 2 is directed to an automotive application, techniques described herein may be applied to other applications.

Figure 3:
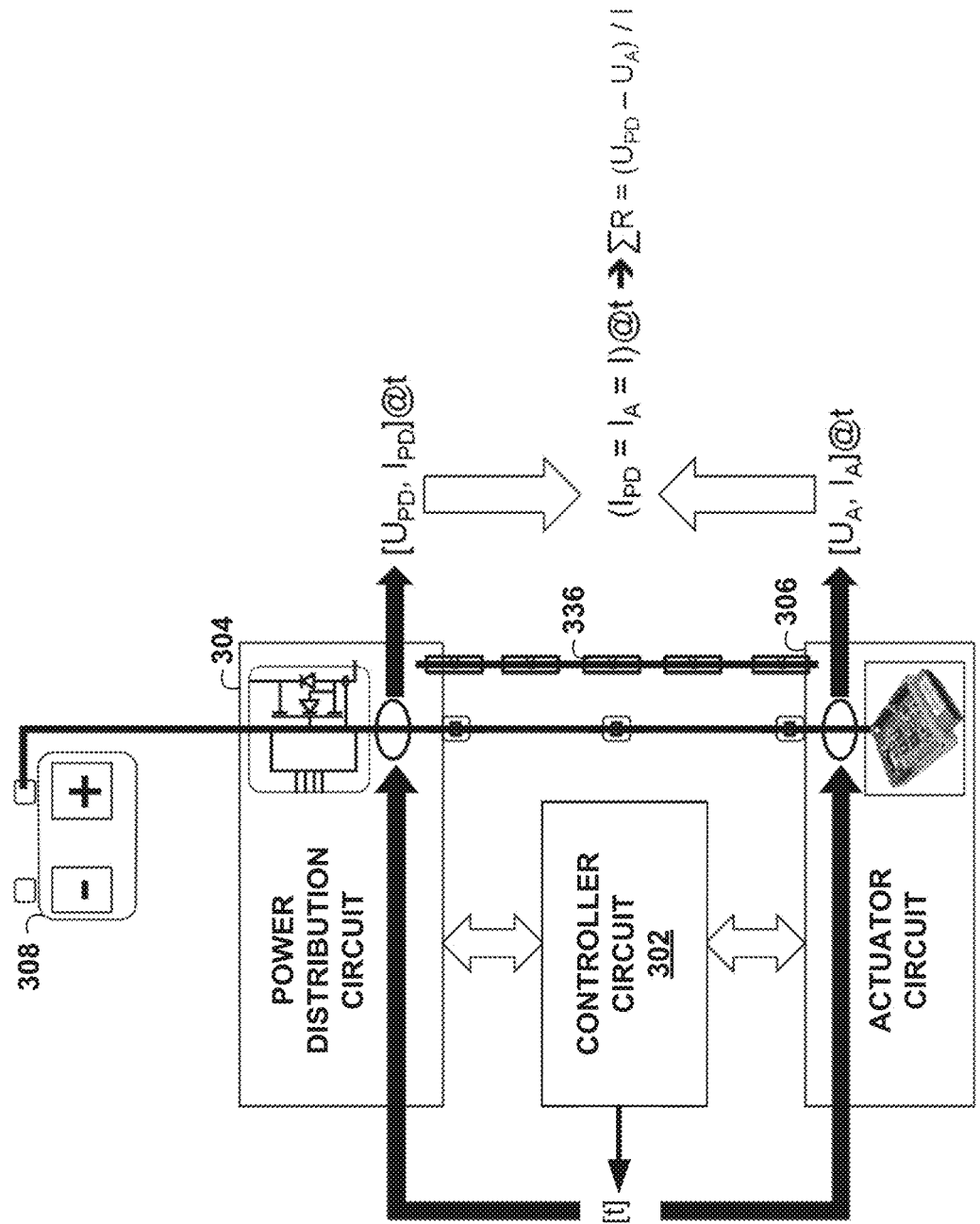
FIG. 3 is a conceptual diagram illustrating an example process to calculate a resistance value using time-synchronization, in accordance with one or more techniques of this disclosure.

FIG. 3 is a conceptual diagram illustrating an example process to calculate a resistance value using time-synchronization, in accordance with one or more techniques of this disclosure. In the example of FIG. 3, wire resistance for one or more electrical components 336 is measured by making a time-synchronized voltage and current measurement at both sides of the one or more electrical components 336 (e.g., power distribution circuit 304 and actuator circuit 306). Controller circuit 302 may use time-synchronization measurement on both sides of the one or more electrical components 336 to help to insure an accuracy of calculating a resistance value for one or more electrical components 336. As discussed below with respect to FIG. 4, a goal to calculate the resistance value of one or more electrical components 336 is to have the same current flowing from supply 308 in the one or more electrical components 336 while power distribution circuit 304 outputs voltage and actuator circuit 306 measures voltage to help to avoid resistance calculation errors. In this way, controller circuit 302 may be configured to calculate the resistance value for one or more electrical components 336 during operation of actuator circuit 306 and may be accurate due to high current measurement. For example, controller circuit 302 may calculate the resistance value by calculating $(I_{PD}=I_A=I)@t \rightarrow \Sigma R=(U_{PD}-U_A)/I$.

However, when calculating a resistance value using the techniques of FIG. 3, controller circuit 302 may use time-synchronize measurements which may add complexity and may be applied only at a limited number of lines due to synchronization complexity. As such, controller circuit 302 may risk a false un/detection due to an unsynchronized measurement. Moreover, controller circuit 302 may take the "measurement execution time" in consideration (e.g., refresh, rate time).

Figure 4:
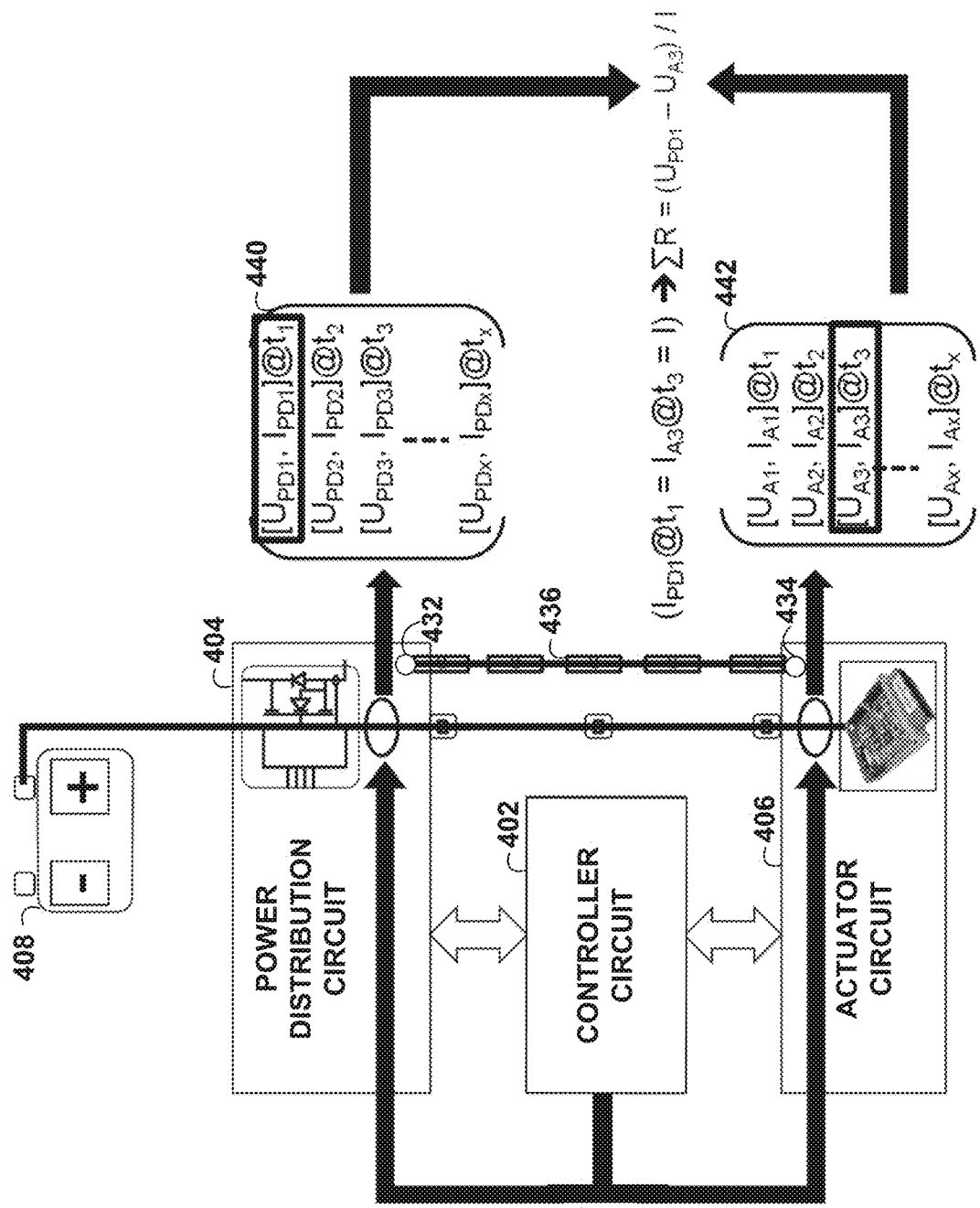
FIG. 4 is a conceptual diagram illustrating a first example system configured to calculate a resistance value using current flows, in accordance with one or more techniques of this disclosure.

FIG. 4 is a conceptual diagram illustrating a first example system configured to calculate a resistance value using current flows, in accordance with one or more techniques of this disclosure. As discussed above, there may be drawbacks when using time-synchronize measurements, which may refer to measurements taken at the same time (e.g., both measurements taken at $t_1, t_2, t_3, \ldots, t_x$) to calculate a resistance value for one or more electrical components 436.

In the example of FIG. 4, rather than relying on time-synchronize measurement, controller circuit 402 may look up similar current values on the measurement databases 440, 442 (e.g., historical measurement databases 440, 442) to evaluate a resistance value for one or more electrical components 436. For example, power distribution circuit 404 may generate measurement database 440 to include a first power distribution (PD) node voltage ($U_{PD1}$) measured at a first node 432 by power distribution circuit 404 at a first time ($t_1$) when a first current ($I_{PD1}$) flows from supply 408, via one or more electrical components 436, to second node 434. In this example, power distribution circuit 404 may generate measurement database 440 to include a second PD node voltage ($U_{PD2}$) measured at first node 432 by power distribution circuit 404 at a second time ($t_2$) when a second current ($I_{PD2}$) flows from supply 408, via one or more electrical components 436, to second node 434. Similarly, power distribution circuit 404 may generate measurement database 440 to include a third PD node voltage ($U_{PD3}$) measured at first node 432 by power distribution circuit 404 at a third time ($t_3$) when a third current ($I_{PD3}$) flows from supply 408, via one or more electrical components 436, to second node 434 and so on. While the example of FIG. 4 shows that measurement database 440 includes 'x' number of measurements that includes at least four, other examples may include fewer than four measurements or more than four measurements.

Power distribution circuit 404 may output an indication of measurement database 440 to controller circuit 402. For example, power distribution circuit 404 may separately output each measurement to controller circuit 402. In some examples, power distribution circuit 404 may output a portion of measurement database 440 (e.g., two or more measurements of measurement database 440) to controller circuit 402 or the entire measurement database 440 (e.g., all measurements of measurement database 440) to controller circuit 402.

Similarly, actuator circuit 406 may generate measurement database 442 to include a first actuator node voltage ($U_{A1}$) measured at a second node 434 by actuator circuit 406 at a first time ($t_1$) when a first current ($I_{A1}$) flows from supply 408, via one or more electrical components 435, to second node 434. In this example, actuator circuit 406 may generate measurement database 442 to include a second actuator node voltage ($U_{A2}$) measured at second node 434 by actuator circuit 406 at a second time (t 2) when a second current ($I_{A2}$) flows from supply 408, via one or more electrical components 436, to second node 434. Similarly, actuator circuit 406 may generate measurement database 442 to include a third actuator node voltage ($U_{a3}$) measured at second node 434 by actuator circuit 406 at a third time ($t_3$) when a third current ($I_{A3}$) flows from supply 408, via one or more electrical components 436, to second node 434 and so on. While the example of FIG. 4 shows that measurement database 440 includes 'x' number of measurements that includes at least four, other examples may include fewer than four measurements or more than four measurements.

Actuator circuit 406 may output an indication of measurement database 442 to controller circuit 402. For example, actuator circuit 406 may separately output each measurement to controller circuit 402. In some examples, actuator circuit 406 may output a portion of measurement database 442 (e.g., two or more measurements of measurement database 442) to controller circuit 402 or the entire measurement database 442 (e.g., all measurements of measurement database 440) to controller circuit 402.

In accordance with the techniques of the disclosure, controller circuit 402 may receive, from power distribution circuit 404, a first node voltage (e.g., $U_{PD1}$) measured at first node 432 by power distribution circuit 404 at a first time (e.g., $t_1$) when a first current (e.g., $I_{PD1}$) flows between first node 432 and second node 434. For example, controller circuit 402 may receive an indication of both a first node voltage (e.g., $U_{PD1}$) and a first current (e.g., $I_{PD1}$).

Controller circuit 402 may receive, from actuator circuit 434, a second node voltage (e.g., $U_{a3}$) measured at second node 434 by actuator circuit 406 at a second time (e.g., t3) when a second current flows (e.g., $I_{A3}$) between first node 432 and second node 434. For example, controller circuit 402 may receive an indication of both a first node voltage (e.g., $U_{A3}$) and a first current (e.g., $I_{A3}$). In this example, the first time (e.g., $t_1$) is different from the second time (e.g., $t_3$). In this example, controller circuit 402 may determine that the first current corresponds to the second current based on a determination that a difference between the first indication of the first current received from power distribution circuit 404 and the second indication of the second current received from actuator circuit 406 is less than a difference threshold (e.g., a pre-configured threshold, a user-specified threshold, or a threshold determined by controller circuit 402).

Each measurement value performed by power distribution circuit 404 and actuator circuit 406 may be collected and stored by a device (e.g., a microcontroller). For example, the device may collect and store (($U_{PD1}$,$I_{PD1}$) during a period of time from $t_1$ to $t_n$, and ($U_{A1}$,$I_{A1}$) during the period of time from $t_1$ to $t_n$). The device may, after collecting and storing, send the measurements to controller circuit 402 for analysis. In some examples, power distribution circuit 404 may store measurement database 440 and/or actuator circuit 406 may store measurement database 442. In this example, power distribution circuit 404 may transfer at least a portion of measurement database 440 to controller circuit 402 and/or actuator circuit 406 may transfer at least a portion of measurement database 442 to controller circuit 402.

Responsive to a determination that the first current corresponds to the second current, controller circuit 402 may calculate, using the first node voltage and the second node voltage, a resistance value for one or more electrical components 436. For example, controller circuit 402 may calculate the resistance value by calculating ($I_{PD}$@$t_1$=$I_{A3}$@$t_3$=I)→$\Sigma R$=($U_{PD1}$−$U_{A3}$)/I. For example, controller circuit 402 may determine a difference between the first node voltage and the second node voltage. In this example, controller circuit 402 may determine an average value of the first current and the second current and divide the difference by the average value.

In some examples, controller circuit 402 may determine an average resistance value for one or more electrical components 436. For example, controller circuit 402 may receive a third node voltage measured at first node 432 by power distribution circuit 404 at a third time when a third current flows between first node 432 and second node 434 and a third indication of the third current. For instance, controller circuit 402 may receive an indication of both the third node voltage (e.g., $U_{PD2}$) and a third current (e.g., $I_{PD2}$). In this example, controller circuit 402 may receive a fourth node voltage measured at second node 434 by actuator circuit 406 at a fourth time when a fourth current flows between first node 432 and second node 434 and a fourth indication of the fourth current. For instance, controller circuit 402 may receive an indication of both the fourth node voltage (e.g., $U_{A1}$) and a fourth current (e.g., $I_{A1}$). The third time and the fourth time may be different. For example, $t_2$ and $t_1$ may be different.

Responsive to a determination that a difference between the third indication of the third current received from the first device and the fourth indication of the fourth current received from the second device is less than the difference threshold, controller circuit 402 may calculate, using the first node voltage measured at the third time and the second node voltage measured at the fourth time, a second resistance value for the one or more electrical components electrically connecting the first node and the second node. For example, controller circuit 402 may determine a difference between the third node voltage and the fourth node voltage. In this example, controller circuit 402 may determine an average value of the third current and the fourth current and divide the difference by the average value.

Controller circuit 402 determine an averaged resistance value using the first resistance value and the second resistance value. For example, controller circuit 402 may determine the average the first resistance value and the second resistance value as a mean of the first resistance value and the second resistance value.

Configuring controller circuit 402 to calculate a resistance value responsive to a determination that the first current corresponds to the second current may help to avoid complex time-synchronization (see FIG. 3). In this way, controller circuit 402, power distribution circuit 404, and actuator circuit 406 may not necessarily have a perfect time-synchronized measurements on both sides of one or more electrical components 436 but instead use current to help to ensure an accuracy of the calculation of the resistance value. For example, controller circuit 402 may measure voltage and current at each part of one or more electrical components 436, which may result in power distribution circuit 404 and actuator circuit 406 making regular unsynchronized measurements and storing the synchronized voltage and current measurement in measurement databases 440, 442 (e.g., memory tables). In this example, controller circuit 402 may "look" for the same current value in the two tables and used the voltage/current (U/I) measurement at different times for calculating the resistance value. Using the same current value to calculate the resistance value, may help to simplify the "wire check health" at system level and may be extended to a larger number of wires. That is, while FIG. 4 only shows a resistance value calculation for one "wire" that includes one or more electrical components 436, some examples may configure controller circuit 402 to calculate more than one wires. In addition, using the same current value to calculate the resistance value may help to allow power distribution circuit 404 and actuator circuit 406 to locally perform data collection as a subtask even with a different frequency from each other, which may allow controller circuit 402 to postpone computations and/or power distribution circuit 404 and actuator circuit 406 can postpone communication effort.

Advantages of the system of FIG. 4 may include one or more of: a simple implementation, can be applied during power distribution operations by power distribution circuit 404, an accurate measurement due to high current value measurement, no measurement synchronization is necessary, no hardware modification is necessary. The system of FIG. 4 may use storage of measurement data historical and measurement can be at different temperature. The power distribution circuit 404 and actuator circuit 406 may perform a voltage and current measurement using a power switch.

Figure 5:
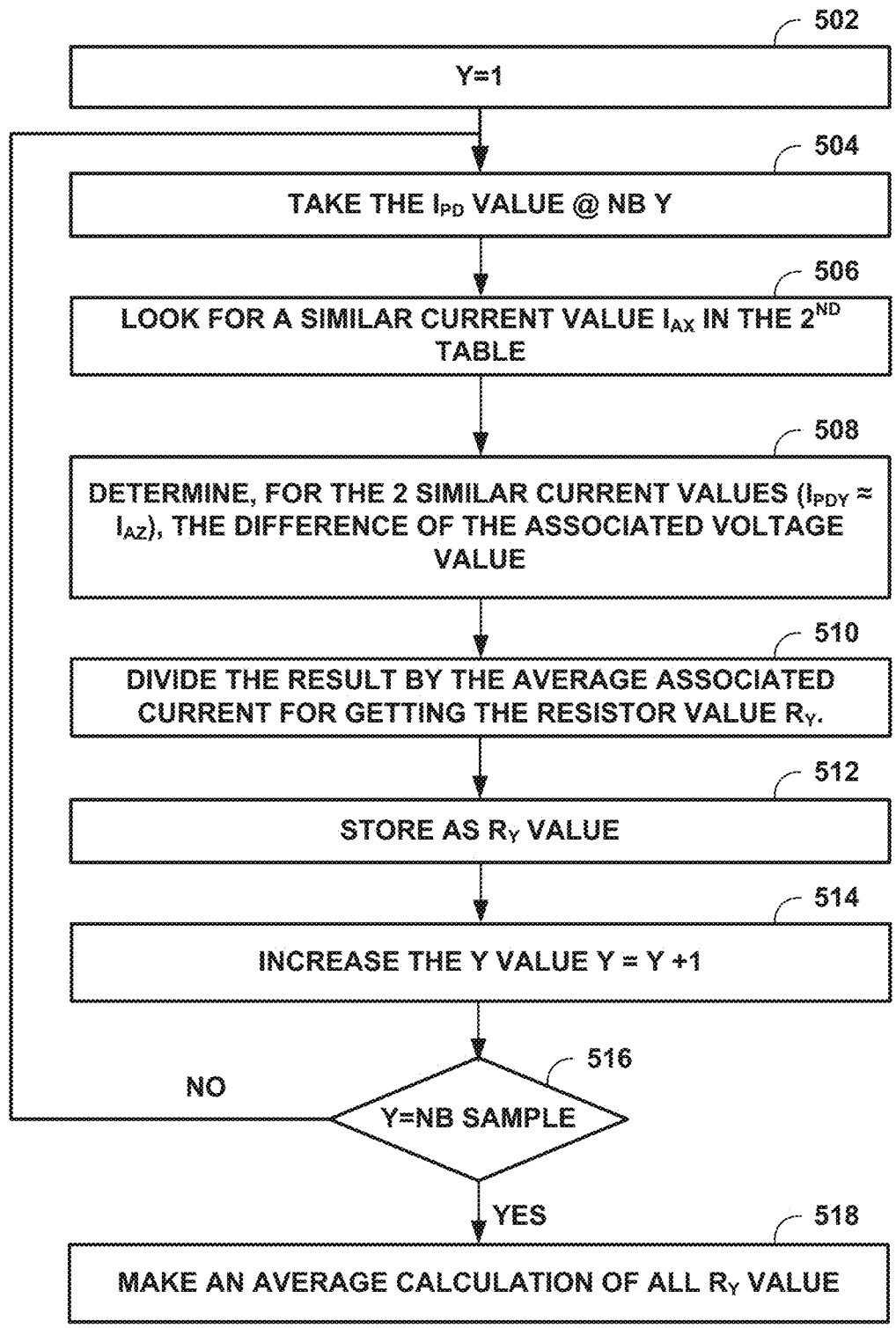
FIG. 5 is a flow chart illustrating the example process of FIG. 4, in accordance with one or more techniques of this disclosure.

FIG. 5 is a flow chart illustrating the example process of FIG. 4, in accordance with one or more techniques of this disclosure. In the example of FIG. 5, controller circuit 402 may initialize variable 'Y' to 1 (502). Controller circuit 402 may take the current (e.g., $I_{PD}$) at number (NB) Y (504). For example, controller circuit 402 may take the current $I_{PD1}$ (e.g., the first value in measurement database 440) in response to determining that Y is set to 1. Controller circuit 402 may look for a similar current value $I_{AX}$ in the second table (506). For example, controller circuit 402 may look for a similar current value $I_{AX}$ in measurement database 442. For example, controller circuit 402 may determine that $I_{PD1}$ corresponds to $I_{AZ}$ (e.g., $I_{A2}$), where Z is an integer value.

Controller circuit 402 may determine, for the second similar current value (e.g., $I_{PDY} \approx I_{AZ}$), the difference of the associated voltage value (508). For example, controller circuit 402 may determine an absolute value of $U_{PDY}$ minus $U_{AZ}$. Controller circuit 402 may divide the result by the averaged associated current to calculate the resistor value $R_y$ (510). For example, controller circuit 402 may divide the result of calculating the absolute value of $U_{PDY}$ minus $U_{AZ}$ by an average of $I_{PDY}$ and $I_{AZ}$. For instance, controller circuit 402 may divide the result of calculating the absolute value of $U_{PD1}$ minus $U_{A2}$ by an average of $I_{PD1}$ and $I_{A2}$. Controller circuit 402 may store the result of calculating the absolute value of $U_{PDY}$ minus $U_{AZ}$ by an average of $I_{PDY}$ and $I_{AZ}$ as an $R_y$ value (512). In this example, controller circuit 402 may increase the Y value (e.g., Y=Y+1) (514). In response to determining that Y is not equal to a number a number of values in the first table (NO of step 516), controller circuit 440 may repeat steps 504-514 with the incremented Y value output in step 514. In response, however, to determining that Y is equal to a number a number of values in the first table (YES of step 516), controller circuit 440 may make an average calculation of all $R_Y$ values (518). For example, controller circuit 440 may determine a mean of all the $R_Y$ values stored in step 512 for each value of Y.

Figure 6:
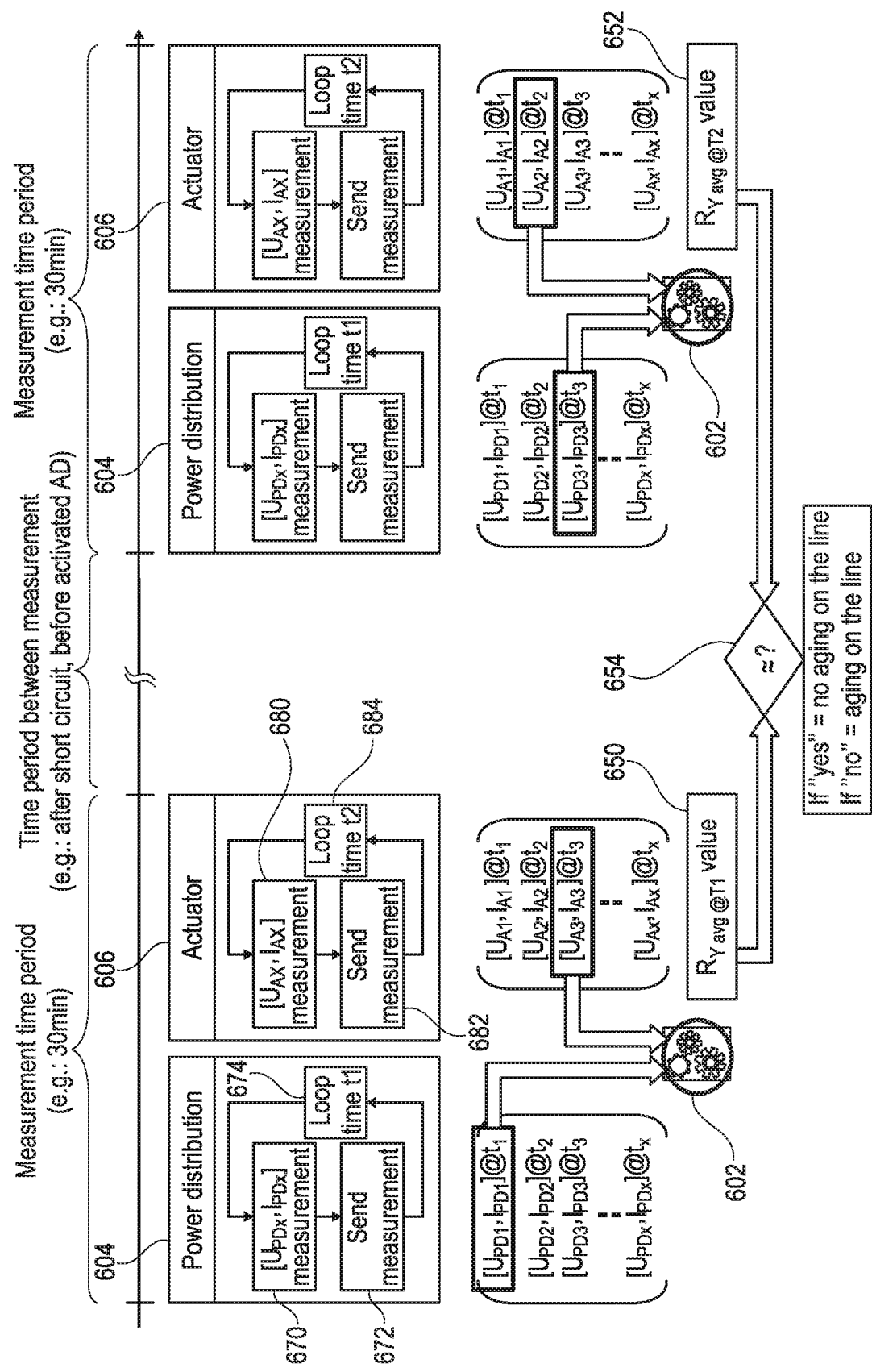
FIG. 6 is a conceptual diagram illustrating a first example process for calculating a resistance value using current flows, in accordance with one or more techniques of this disclosure.

FIG. 6 is a conceptual diagram illustrating a first example process for calculating a resistance value using current flows, in accordance with one or more techniques of this disclosure. In the example of FIG. 6, during a first measurement time period (e.g., 30 minutes), power distribution circuit 604 may generate a node voltage $U_{PDX}$ for a current $I_{PDX}$ (670) and send the measurement [$U_{PDX}$, $I_{PDX}$] to controller circuit 602 (672). The process of steps 670 and 672 may repeat (674). The first measurement time and/or the second measurement time of FIG. 6 may correspond to a start-up, a maintenance interval, or an event, such as, weather (e.g., a cold temperature), a replacement of actuator 606, or a detection of a fault.

During the first measurement time period (e.g., 30 minutes), actuator circuit 606 may generate a node voltage $U_{AX}$ for a current $I_{AX}$ (680) and send the measurement [$U_{AX}$, $I_{AX}$] to controller circuit 602 (682). The process of steps 680 and 682 may repeat (684).

Controller circuit 602 may determine that the first current $I_{PD1}$ Corresponds to the second current $I_{A3}$ based on a determination that a difference between the first indication of the first current $I_{PD1}$ received from power distribution circuit 604 and the second indication of the second current $I_{A3}$ received from actuator circuit 606 is less than a difference threshold (e.g., a pre-configured threshold, a user-specified threshold, or a threshold determined by controller circuit 602). In this example, responsive to the determination that the first current corresponds to the second current, controller circuit 602 may calculate, using the first node voltage $U_{PD1}$ and the second node voltage $U_{A3}$, a resistance value 650 ($R_{Y\,avg\,@T1}$).

Similarly, during a second measurement time period (e.g., 30 minutes) that occurs after a time period (e.g., after short circuit or before activation of the actuator 606), power distribution circuit 604 may generate a node voltage $U_{PD3}$ for a current $I_{PD3}$ and send the measurement [$U_{PD3}$, $I_{PD3}$] to controller circuit 602. Similarly, during the second measurement time period, actuator circuit 606 may generate a node voltage $U_{A2}$ for a current $I_{A2}$ and send the measurement

[$U_{A2}$, $I_{A2}$] to controller circuit 602. Controller circuit 602 may determine that the current $I_{PD3}$ corresponds to the current $I_{A2}$ based on a determination that a difference between the first indication of the first current $I_{PD3}$ received from power distribution circuit 604 and the second indication of the current $I_{A2}$ received from actuator circuit 606 is less than a difference threshold (e.g., a pre-configured threshold, a user-specified threshold, or a threshold determined by controller circuit 602). In this example, responsive to the determination that the current $I_{PD3}$ corresponds to the current $I_{A2}$, controller circuit 602 may calculate, using the node voltage $U_{PD3}$ and the node voltage $U_{A2}$, a resistance value 652 ($R_{Y\ avg\ @T2}$).

Controller circuit 602 or another device may determine whether aging has occurred based on the resistance value 650 and resistance value 652. For example, resistance value 650 may be measured during a first time range. In this example, resistance value 652 may be measured during a second time range. The first time range and the second time range may not overlap. For example, a zero or non-zero time period may occur between the first time range and the second time range. In this example, controller circuit may compare resistance value 650 with resistance value 652. For instance, if resistance value 652 is different from resistance value 650 by the aging threshold, controller circuit 602 may determine that aging on the line has occurred (YES for step 654). If resistance value 652 is not different from resistance value 650 by the aging threshold, controller circuit 602 may determine that aging on the line has not occurred (NO for step 654).

Figure 7:
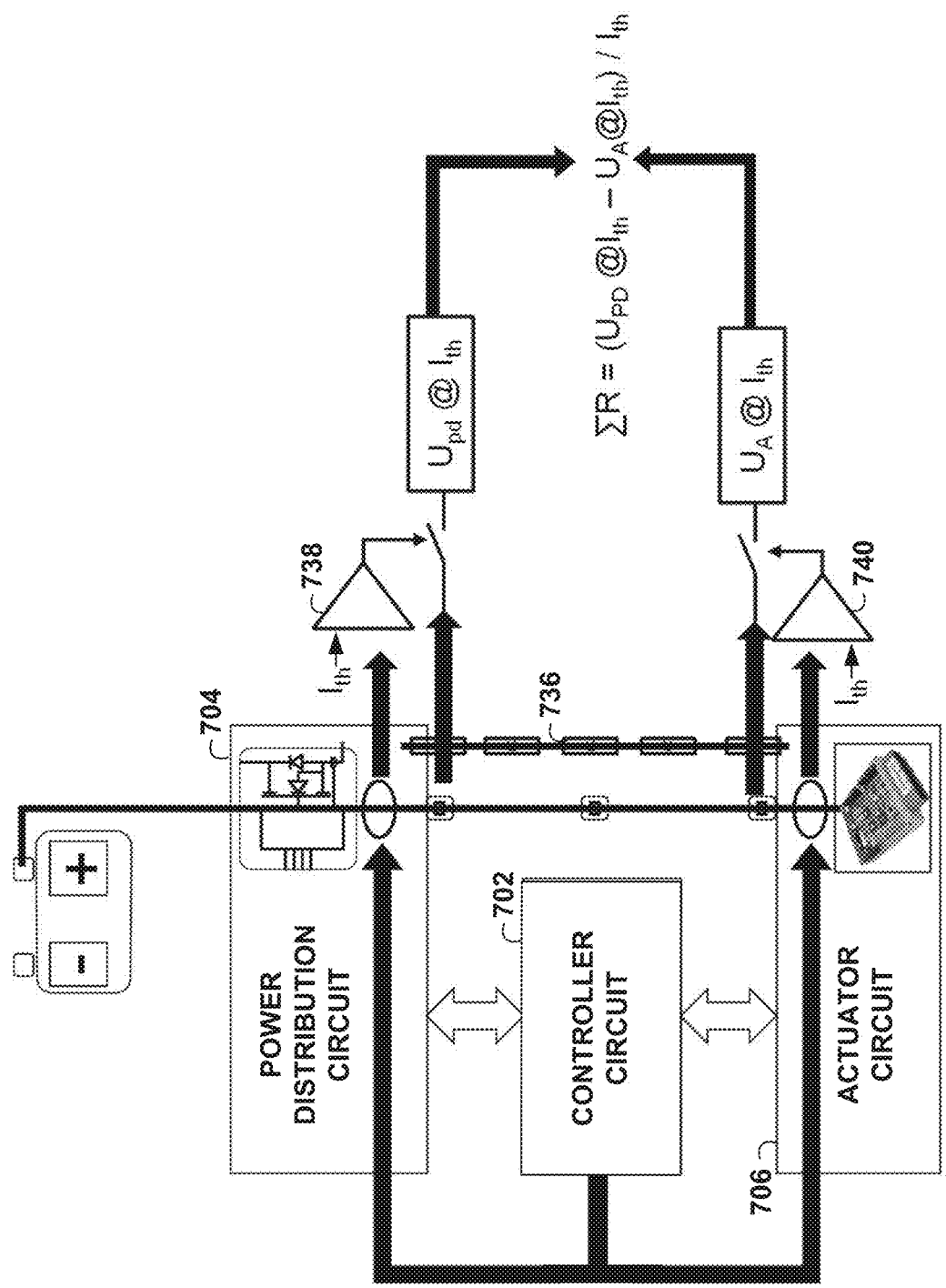
FIG. 7 is a conceptual diagram illustrating a second example system configured to calculate a resistance value using current flows, in accordance with one or more techniques of this disclosure.

FIG. 7 is a conceptual diagram illustrating a second example system configured to calculate a resistance value using current flows, in accordance with one or more techniques of this disclosure. In the example of FIG. 7, power distribution circuit 704 may be configured to output the first node voltage (e.g., $U_{pd}$) when the first current is within a current threshold ($I_{th}$). For example, power distribution circuit 704 may include a first comparator 738 configured to output the first node voltage when the first current is within the current threshold. Similarly, actuator circuit 706 may be configured to output the second node voltage (e.g., $U_A$) when the second current is within a current threshold ($I_{th}$). For example, actuator circuit 706 may include a second comparator 740 configured to output the second node voltage when the second current is within the current threshold.

Controller circuit 702 may be configured to determine that the first current corresponds to the second current in response to power distribution circuit 704 being configured to output the first node voltage when the first current is within the current threshold and actuator circuit 706 being configured to output the second node voltage when the second current is within the current threshold. In this example, controller circuit 702 may calculate the resistance value for one or more electrical components 736 based on the first node voltage and the second node voltage. Controller circuit 702 may calculate the resistance value by calculating $\Sigma R = (U_{PD}@I_{th} - U_A@I_{th})/I_{th}$. For instance, controller circuit 702 may determine a difference between the first node voltage ($U_{PD}$) and the second node voltage ($U_A$) and divide the difference by a current value that is within the current threshold (e.g., $I_{th}$). The example of FIG. 7 may include one or more of the following advantages: simple solution, can be applied during operation, an accurate measurement due to high current value measurement, no measurement time-synchronization, no need to store measurement data historical. While comparators 738 and 740 are shown as external to power distribution circuit 704 and actuator circuit 740, in some examples, comparator 738 may be arranged in power distribution circuit 704 and/or comparator 740 may be arranged in actuator circuit 706.

Figure 8:
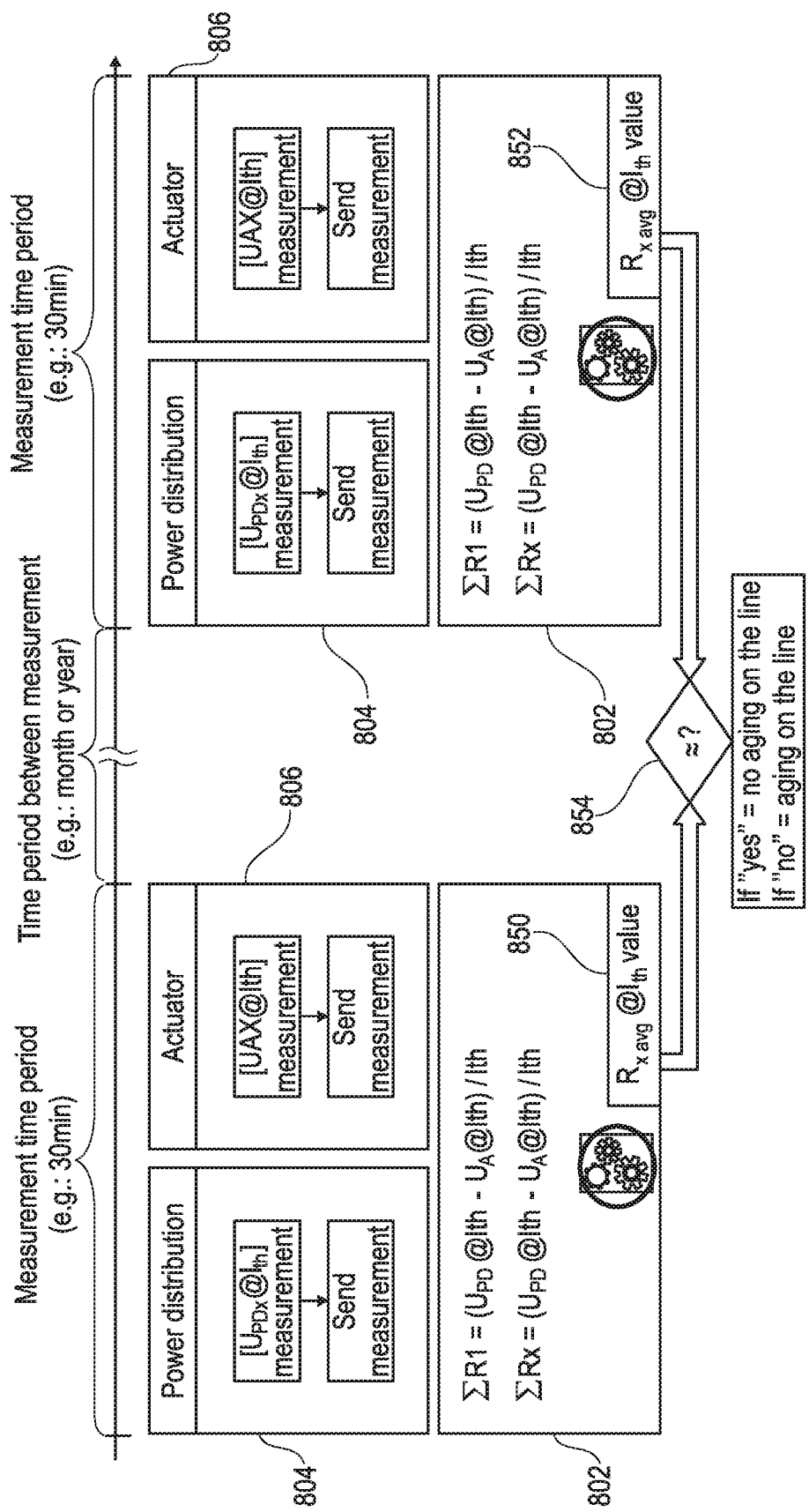
FIG. 8 is a conceptual diagram illustrating a second example process for calculating a resistance value using current flows, in accordance with one or more techniques of this disclosure.

FIG. 8 is a conceptual diagram illustrating a second example process for calculating a resistance value using current flows, in accordance with one or more techniques of this disclosure. In the example of FIG. 8, during a first measurement time period (e.g., 30 minutes), power distribution circuit 804 may generate a node voltage $U_{PDX}$ at the current threshold and send the measurement [$U_{PDX}$] to controller circuit 802. During the first measurement time period (e.g., 30 minutes), actuator circuit 806 may generate a node voltage $U_{AX}$ for the current threshold and send the measurement [$U_{AX}$] to controller circuit 802. The first measurement time and/or the second measurement time of FIG. 8 may correspond to a start-up, a maintenance interval, or an event, such as, weather (e.g., a cold temperature), a replacement of actuator 806, or a detection of a fault.

Controller circuit 802 may calculate, using the first node voltage $U_{PD}$ and the second node voltage $U_A$, a resistance value 850 ($R_{x\ avg}\ @\ I_{th}$). For example, controller circuit 802 may calculate a first resistance value (R1) using a first node voltage and a second node voltage. For instance, controller circuit 802 may calculate $\Sigma R1 = (U_{PD}@I_{th} - U_A@I_{th})/I_{th}$, where $U_{PD}$ is the first node voltage, $I_{th}$ is a current threshold, and $U_A$ is the second node voltage.

Controller circuit 802 may calculate a second resistance value (Rx) using a third node voltage and a fourth node voltage. For example, power distribution circuit 804 may output a third node voltage measured by distribution circuit 804 at a third time for a third current and actuator device 806 may output a fourth node voltage measured by actuator device 806 at a fourth time for a fourth current. The third time and the fourth time may be different. Controller circuit 802 may calculate, using the third node voltage measured at the third time and the fourth node voltage measured at the fourth time, a second resistance value (Rx). For instance, controller circuit 802 may calculate $\Sigma Rx = (U_{PD}@I_{th} - U_A@I_{th})/I_{th}$. In this example, controller circuit 802 may average the resistance values R1 through Rx to determine resistance value 850 ($R_{x\ avg}\ @\ I_{th}$).

Similarly, during a second measurement time period (e.g., 30 minutes) that occurs after a time period (e.g., after short circuit or before activation of the actuator 606), power distribution circuit 804 may generate a node voltage $U_{PDX}$ at the current threshold and send the measurement [$U_{PDX}$] to controller circuit 802. During the second measurement time period (e.g., 30 minutes), actuator circuit 806 may generate a node voltage $U_{AX}$ for the current threshold and send the measurement [$U_{AX}$] to controller circuit 802. Controller circuit 802 may calculate, using the first node voltage $U_{PD}$ and the second node voltage $U_A$, a resistance value 852 ($R_{x\ avg}\ @\ I_{th}$). For example, controller circuit 802 may calculate $\Sigma R1 = (U_{PD}@I_{th} - U_A@I_{th})/I_{th}$ and $\Sigma Rx = (U_{PD}@I_{th} - U_A@I_{th})/I_{th}$, where R1 is a first resistance value and Rx is an 'x' resistance value. In this example, controller circuit 802 may average the resistance values R1 through Rx to determine resistance value 852 ($R_{x\ avg}\ @\ I_{th}$).

Controller circuit 802 or another device may determine whether aging has occurred based on the resistance value 850 and resistance value 852. For example, resistance value 850 may be measured during a first time range. In this example, resistance value 852 may be measured during a second time range. The first time range and the second time range may not overlap. For example, a zero or non-zero time period may occur between the first time range and the second time range. In this example, controller circuit 802 may compare resistance value 850 with resistance value 852. For instance, if resistance value 852 is different from resistance value 850 by the aging threshold, controller circuit 802 may determine that aging on the line has occurred (YES for step 854). If resistance value 852 is not different from resistance value 850 by the aging threshold, controller circuit 802 may determine that an unacceptable amount of aging on the line has not occurred (NO for step 854).

Figure 9:
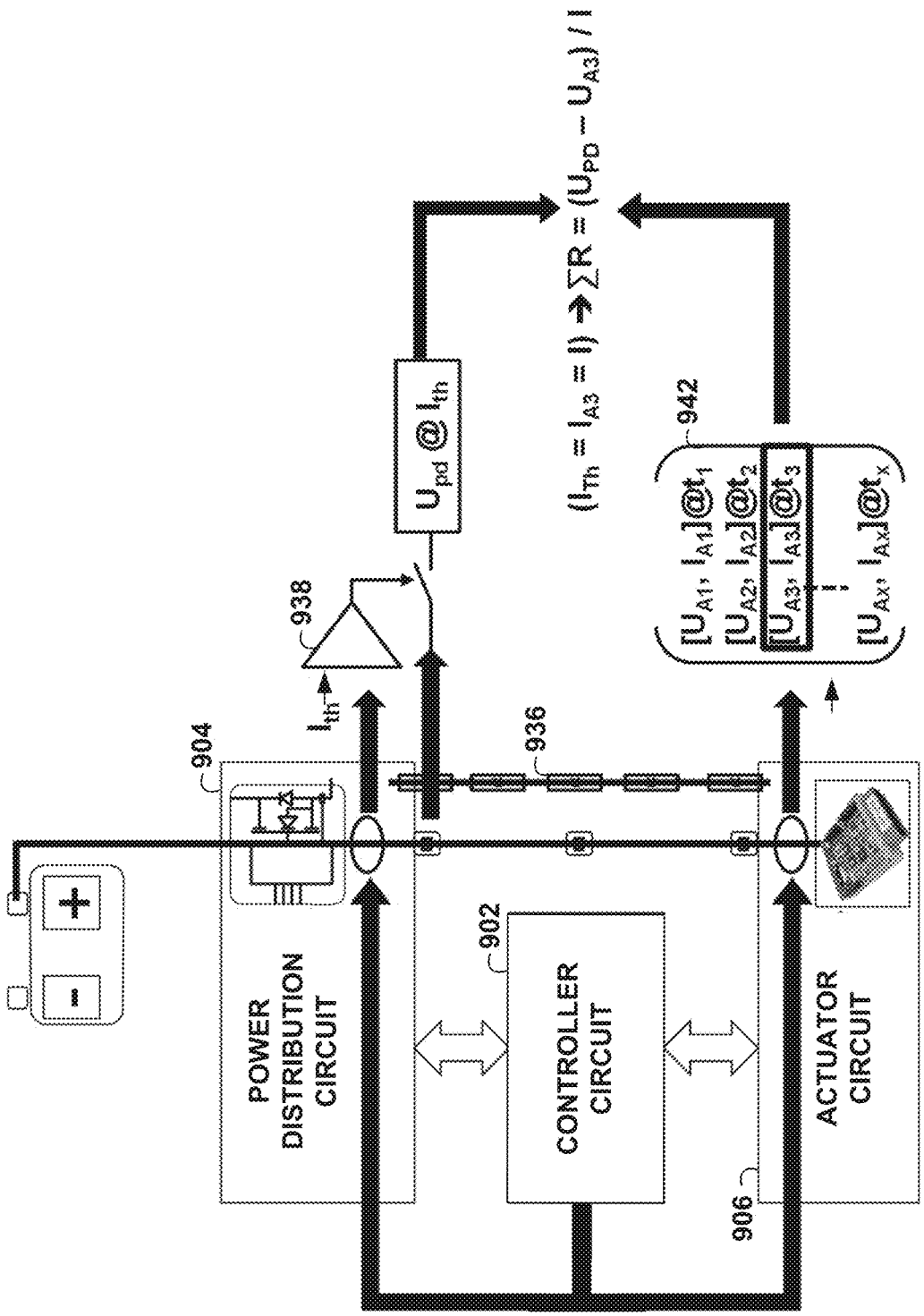
FIG. 9 is a conceptual diagram illustrating a third example system configured to calculate a resistance value using current flows, in accordance with one or more techniques of this disclosure.

FIG. 9 is a conceptual diagram illustrating a third example system configured to calculate a resistance value using current flows, in accordance with one or more techniques of this disclosure. In the example of FIG. 9, actuator circuit 906 may generate measurement database 942 to include a first node voltage ($U_{A3}$) measured by actuator circuit 906 for a first current ($I_{A3}$). Actuator circuit 906 may output an indication of measurement database 942 to controller circuit 902. For example, actuator circuit 906 may output an indication of both the first node voltage ($U_{A3}$) and the first current ($I_{A3}$). In this example, power distribution circuit 904 may be configured to output the second node voltage (e.g., $U_{pd}$) when the second current is within a current threshold ($I_{th}$). For example, power distribution circuit 904 may include a comparator 938 configured to output the second node voltage ($U_{PD}@I_{th}$) when the second current is within the current threshold. While comparator 938 is shown as external to power distribution circuit 704, in some examples, comparator 938 may be arranged in power distribution circuit 904. Moreover, in some examples, comparator 938 may be configured to receive the output of actuator circuit 906 instead of power distribution circuit 904.

Controller circuit 902 may receive an indication of the first current. In this example, controller circuit 902 may determine that the first current ($I_{A3}$) Corresponds to the second current in response to a determination that the indication of the first current received from the first device indicates that the first current is within a current threshold, wherein the second current is within the current threshold.

Controller circuit 902 may, responsive to a determination that the first current corresponds to the second current, calculate, using the first node voltage and the second node voltage, a resistance value for one or more electrical components 936. For example, controller circuit 902 may calculate ($I_{TH}=I_{A3}=I)@t \rightarrow \Sigma R=(U_{PD}-U_{A3})/I$, where $I_{th}$ is the current threshold, $I_{A3}$ is the second current, $U_{PD}$ is the first node voltage, and $U_{A3}$ is the second node voltage. In some examples, controller circuit 902 may determine a difference between the first node voltage and the second node voltage. In this example, controller circuit 902 may determine an average value of the first current and the current threshold and divide the difference by the average value. The system of FIG. 9 may include one or more of the following advantages: a simple implementation, can be applied during operation, accurate measurement due to high current value measurement, no measurement time-synchronization, no need to store measurement data historical, and no hardware modification on the actuator side.

Figure 10:
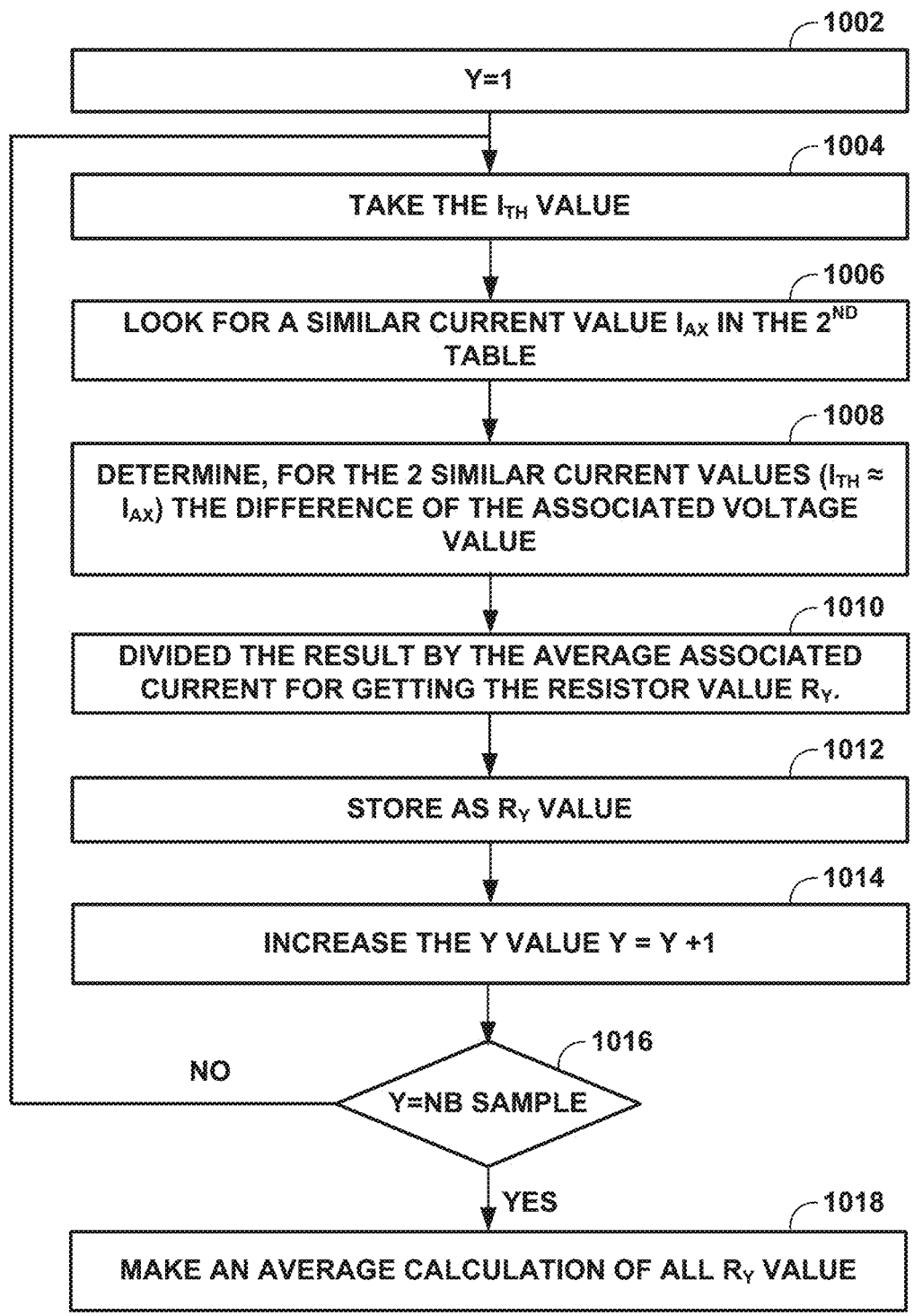
FIG. 10 is a flow chart illustrating the example process of FIG. 9, in accordance with one or more techniques of this disclosure.

FIG. 10 is a flow chart illustrating the example process of FIG. 9, in accordance with one or more techniques of this disclosure. In the example of FIG. 10, controller circuit 902 may initialize variable 'Y' to 1 (1002). Controller circuit 902 may take the threshold current (e.g., $I_{th}$) (1004). Controller circuit 902 may look for a similar current value $I_{AX}$ in the second table (1006). For example, controller circuit 402 may look for a similar current value $I_{AX}$ in measurement database 942. For example, controller circuit 902 may determine, for the second similar current value (e.g., $I_{TH} \approx I_{AZ}$), the difference of the associated voltage value (1008). For example, controller circuit 902 may determine an absolute value of $U_{PD}$ minus $U_{AZ}$. Controller circuit 902 may divide the result by the averaged associated current for getting the resistor value $R_y$ (1010). For example, controller circuit 902 may divide the result of calculating the absolute value of $U_{PD}$ minus $U_{AZ}$ by an average of $I_{TH}$ and $I_{AZ}$. For instance, controller circuit 902 may divide the result of calculating the absolute value of $U_{PD1}$ minus $U_{A2}$ by an average of the threshold current $I_{TH}$ and $I_{A2}$. Controller circuit 902 may store the result of calculating the absolute value of $U_{PD}$ minus $U_{AZ}$ by an average of $I_{TH}$ and $I_{AZ}$ as an $R_y$ value (1012). In this example, controller circuit 902 may increase the Y value (e.g., Y=Y+1) (1014). In response to determining that Y is not equal to a number a number of values output by power distribution circuit 904 (NO of step 1016), controller circuit 902 may repeat steps 1004-1014 with the incremented Y value output in step 914. In response, however, to determining that Y is equal to a number a number of values output by power distribution circuit 904 (YES of step 1016), controller circuit 902 may make an average calculation of all $R_Y$ values (1018). For example, controller circuit 902 may determine a mean of all the $R_Y$ values stored in step 1012 for each value of Y.

Figure 11:
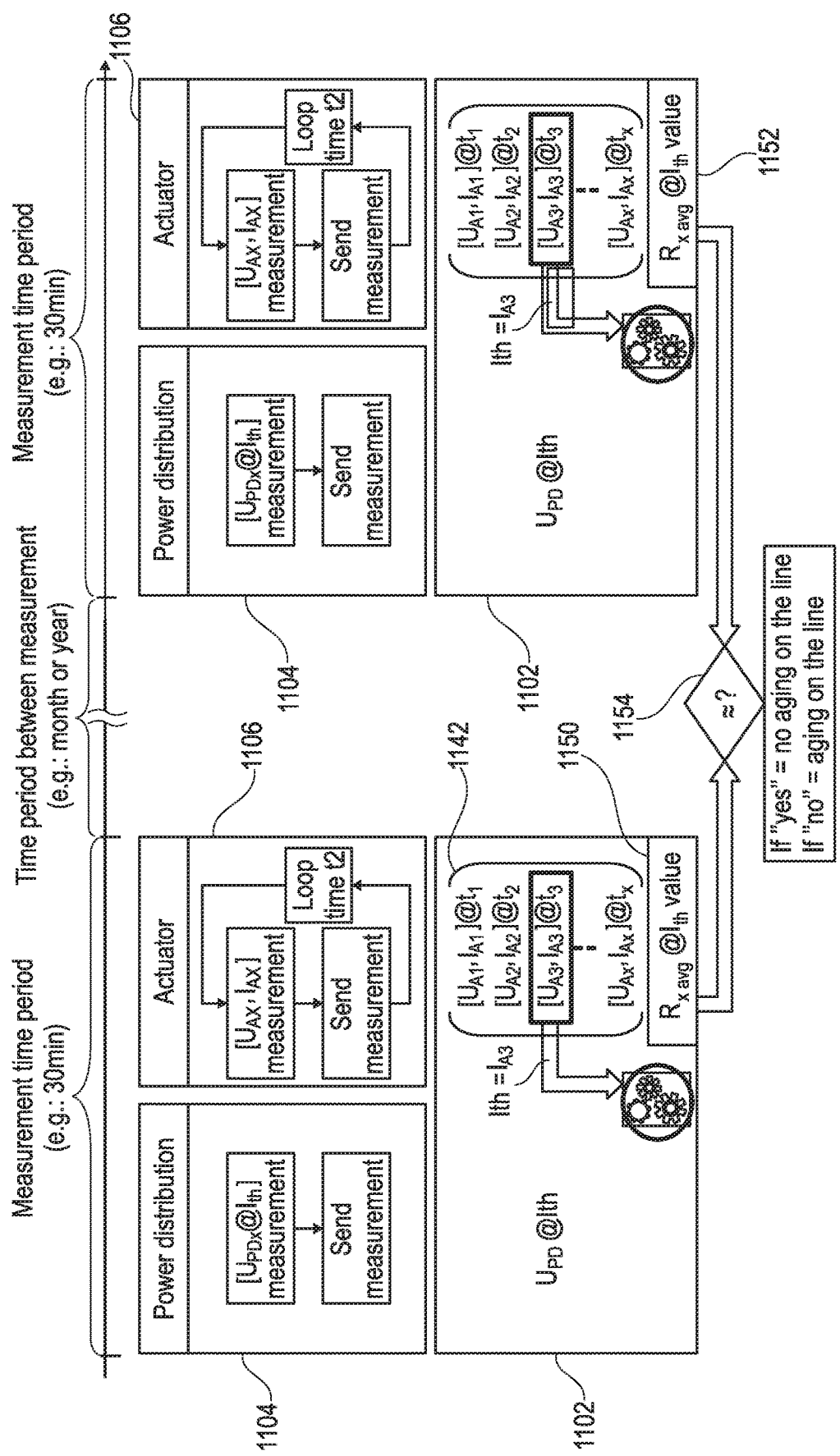
FIG. 11 is a conceptual diagram illustrating a third example process for calculating a resistance value using current flows, in accordance with one or more techniques of this disclosure.

FIG. 11 is a conceptual diagram illustrating a third example process for calculating a resistance value using current flows, in accordance with one or more techniques of this disclosure. FIGS. 1-10 are discussed with respect to FIG. 11 for example purposes only.

In the example of FIG. 11, during a first measurement time period (e.g., 30 minutes), power distribution circuit 1104 may generate a node voltage $U_{PDX}$ at the current threshold and send the measurement [$U_{PDX}@I_{th}$] to controller circuit 1102. During the first measurement time period (e.g., 30 minutes), actuator circuit 1106 may generate a node voltage $U_{AX}$ for a current $I_{AX}$ and send the measurement [$U_{AX}$, $I_{AX}$] to controller circuit 902. The first measurement time and/or the second measurement time of FIG. 11 may correspond to a start-up, a maintenance interval, or an event, such as, weather (e.g., a cold temperature), a replacement of actuator 1106, or a detection of a fault.

Controller circuit 1102 may receive an indication of the first current. In this example, controller circuit 1102 may determine that the first current ($I_{A3}$) of measurement database 1142 corresponds to the second current in response to a determination that the indication of the first current received from the first device indicates that the first current ($I_{A3}$) is within a current threshold ($I_{th}$). Controller circuit 1102 may, responsive to a determination that the first current corresponds to the second current, calculate, using the first node voltage and the second node voltage, a resistance value 1150 ($R_{x\ avg}@I_{th}$ value). Controller circuit 1102 may calculate a second resistance value (Rx) using a third node voltage and a fourth node voltage. For example, power distribution circuit 1104 may output a third node voltage measured by distribution circuit 1104 and actuator device 1106 may output a fourth node voltage measured by actuator device 806 at a fourth time for a fourth current. The third time and the fourth time may be different. Responsive to a determination that the indication of the third current received from the actuator circuit 1106 indicates that the third current is within the current threshold, controller circuit 1102 may calculate, using the third node voltage measured at the third time and the fourth node voltage measured at the fourth time, a second resistance value (Rx).

In this example, controller circuit 802 may average the resistance values R1 through Rx to determine resistance value 1150 ($R_{x\ avg}$ @ $I_{th}$).

Similarly, during a second measurement time period (e.g., 30 minutes) that occurs after a time period (e.g., after short circuit or before activation of the actuator 1106), power distribution circuit 1104 may generate a node voltage $U_{PDX}$ at the current threshold and send the measurement [$U_{PDX}$@$I_{th}$] to controller circuit 1102. During the second measurement time period (e.g., 30 minutes), actuator circuit 1106 may generate a node voltage $U_{AX}$ for a current $I_{AX}$ and send the measurement [$U_{AX}$, $I_{AX}$] to controller circuit 902.

Controller circuit 1102 may receive an indication of the first current for the second measurement time period. In this example, controller circuit 1102 may determine that the first current ($I_{A3}$) of measurement database 1142 corresponds to the second current in response to a determination that the indication of the first current received from the first device indicates that the first current ($I_{A3}$) is within a current threshold ($I_{th}$). Controller circuit 1102 may, responsive to a determination that the first current corresponds to the second current, calculate, using the first node voltage and the second node voltage, a resistance value 1152 ($R_{x\ avg}$ @ $I_{th}$ value).

Controller circuit 1102 or another device may determine whether aging has occurred based on the resistance value 1150 and resistance value 1152. For example, resistance value 1150 may be measured during a first time range. In this example, resistance value 1152 may be measured during a second time range. The first time range and the second time range may not overlap. For example, a zero or non-zero time period may occur between the first time range and the second time range. In this example, controller circuit 1102 may compare resistance value 1150 with resistance value 1152. For instance, if resistance value 1152 is different from resistance value 1150 by the aging threshold, controller circuit 1102 may determine that aging on the line has occurred (YES for step 1154). If resistance value 1152 is not different from resistance value 1150 by the aging threshold, controller circuit 1102 may determine that aging on the line has not occurred (NO for step 1154).

Figure 12:
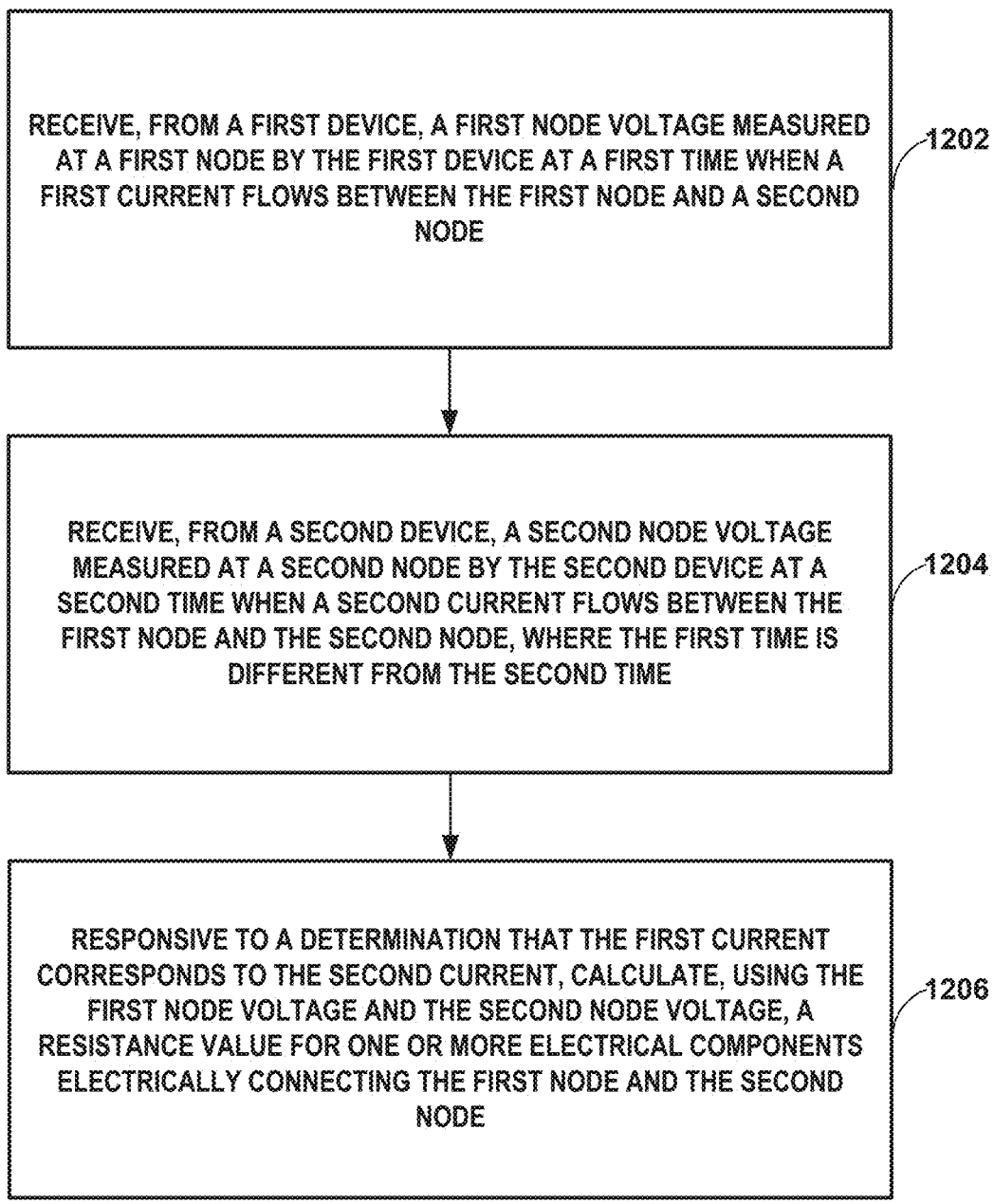
FIG. 12 is a flow diagram illustrating a process for calculating a resistance value, in accordance with this disclosure.

FIG. 12 is a flow diagram illustrating a process for calculating a resistance value, in accordance with this disclosure. FIG. 12 is discussed with FIGS. 1-11 for example purposes only.

Controller circuit 102 may receive, from a first device 104, a first node voltage 122 at a first node 132 measured by first device 104 at a first time when a first current flows between first node 132 and second node 134 (1202). First node 132 may be at a pin of first device 104. Second node 134 may be at a pin of second device 106. While examples described herein may describe first device as a power distribution circuit and the second device as an actuator circuit or the first device as an actuator circuit and the second device as a power distribution circuit, first device and/or second device may be different devices.

Controller circuit 102 may receive, from second device 106, a second node voltage 124 at second node 134 measured by second device 106 at a second time when a second current flows between first node 132 and second node 134, where the first time is different from the second time (1204). Controller circuit 102 may, responsive to determining that the first current corresponds to the second current, calculate using the first node voltage 122 and the second node voltage 124, a resistance value 126 for one or more electrical components 136 electrically connecting first node 132 and second node 134 (1206). One or more electrical components 136 may include one or more of: one or more printed circuit board traces, one or more wires, or one or more connectors.

For example, controller circuit 102 may receive a first indication of both a first node voltage 122 and first current from first device 104 (e.g., [$U_{PD1}$, $I_{PD1}$]). In this example, controller circuit 102 may receive a second indication of both a second node voltage 124 and second current from second device 106 (e.g., [$U_{A3}$, $I_{A3}$]. In response to a determination that a difference between the first indication of the first current received from first device 104 and the second indication of the second current received from second device 106 is less than a difference threshold, controller circuit 102 may calculate, using the first node voltage 122 and the second node voltage 124, a resistance value 126 for one or more electrical components 136. For example, controller circuit 102 may determine a difference between the first node voltage 122 (e.g., $U_{PD1}$) and the second node voltage 124 ($U_{A3}$) and determine an average value of the first current (e.g., $I_{PD1}$) and the second current ($I_{A3}$). In this example, controller circuit 102 may divide the difference between first node voltage 122 (e.g., $U_{PD1}$) and second node voltage 124 ($U_{A3}$) by the average value of the first current (e.g., $I_{PD1}$) and the second current ($I_{A3}$) to generate resistance value 126.

In some examples, first device 104 may be configured to output first node voltage 122 (e.g., $U_{pd}$) when the first current is within a current threshold ($I_{th}$). For example, first device 104 may include a first comparator configured to output first node voltage 122 when the first current is within the current threshold (see FIG. 7). Similarly, second device 106 may be configured to output second node voltage 124 (e.g., $U_A$) when the second current is within a current threshold ($I_{th}$). For example, second device 106 may include a second comparator configured to output second node voltage 124 when the second current is within the current threshold. In this example, controller circuit 102 may be configured to determine that the first current corresponds to the second current in response to first device 104 being configured to output first node voltage 122 when the first current is within the current threshold and second device 106 being configured to output second node voltage 124 when the second current is within the current threshold. In this example, controller circuit 102 may calculate resistance value 126 for one or more electrical components 136 based on first node voltage 122 and second node voltage 124. For example, controller circuit 102 may determine a difference between first node voltage 122 and second node voltage 124 and divide the difference by a current value that is within the current threshold.

First device 104 may be configured to output an indication of both the first node voltage 122 ($U_{A3}$) and the first current ($I_{A3}$) (see FIG. 9). In this example, second device 106 may be configured to output the second node voltage (e.g., $U_{pd}$) when the second current is within a current threshold ($I_{th}$). For example, second device 106 may include a comparator configured to output second node voltage 124 ($U_{PD}$@$I_{th}$) when the second current is within the current threshold. In this example, controller circuit 102 may determine that the first current ($I_{A3}$) corresponds to the second current in response to a determination that the indication of the first current received from the first device indicates that the first current is within the current threshold. Controller circuit 102 may, responsive to the determination that the first current corresponds to the second current, calculate, using first node voltage 122 and second node voltage 124, a resistance value for one or more electrical components 136. For example, controller circuit 102 may determine a difference between first node voltage 122 and second node voltage 124. In this example, controller circuit 102 may determine an average value of the first current and the current threshold and divide the difference by the average value.

The following clauses may illustrate one or more aspects of the disclosure.

Clause 1. A controller circuit configured to: receive, from a first device, a first node voltage measured at a first node by the first device at a first time when a first current flows between the first node and a second node; receive, from a second device, a second node voltage measured at a second node by the second device at a second time when a second current flows between the first node and the second node, wherein the first time is different from the second time; and responsive to a determination that the first current corresponds to the second current, calculate, using the first node voltage and the second node voltage, a resistance value for one or more electrical components electrically connecting the first node and the second node.

Clause 2. The controller circuit of clause 1, wherein, to receive, the first node voltage, the controller circuit is configured to receive a first indication of the first current; wherein, to receive, the second node voltage, the controller circuit is configured to receive a second indication of the second current; and wherein the controller circuit is configured to determine that the first current corresponds to the second current based on a determination that a difference between the first indication of the first current received from the first device and the second indication of the second current received from the second device is less than a difference threshold.

Clause 3. The controller circuit of clause 2, wherein, to calculate the resistance value, the controller circuit is configured to: determine a difference between the first node voltage and the second node voltage; determine an average value of the first current and the second current; and divide the difference by the average value.

Clause 4. The controller circuit of clauses 2-3, wherein the resistance value is a first resistance value and wherein the controller circuit is configured to: receive a third node voltage measured at the first node by the first device at a third time when a third current flows between the first node and a second node and a third indication of the third current; receive a fourth node voltage measured at the second node by the second device at a fourth time when a fourth current flows between the first node and a second node and a fourth indication of the fourth current, wherein the third time and the fourth time are different; responsive to a determination that a difference between the third indication of the third current received from the first device and the fourth indication of the fourth current received from the second device is less than the difference threshold, calculate, using the third node voltage measured at the third time and the fourth node voltage measured at the fourth time, a second resistance value for the one or more electrical components electrically connecting the first node and the second node; and determine an averaged resistance value using the first resistance value and the second resistance value.

Clause 5. The controller circuit of clause 1, wherein, to receive, the first node voltage, the controller circuit is configured to receive an indication of the first current; and wherein the controller circuit is configured to determine that the first current corresponds to the second current in response to a determination that the indication of the first current received from the first device indicates that the first current is within a current threshold, wherein the second current is within the current threshold.

Clause 6. The controller circuit of clause 5, wherein, to calculate the resistance value, the controller circuit is configured to: determine a difference between the first node voltage and the second node voltage; determine an average value of the first current and the current threshold; and divide the difference by the average value.

Clause 7. The controller circuit of clauses 5-6, wherein the resistance value is a first resistance value and wherein the controller circuit is configured to: receive a third node voltage measured at the first node by the first device at a third time when a third current flows between the first node and a second node and an indication of the third current; receive a fourth node voltage measured at the second node by the second device at a fourth time when a fourth current flows between the first node and a second node, wherein the third time and the fourth time are different; responsive to a determination that the indication of the third current received from the first device indicates that the third current is within the current threshold, calculate, using the third node voltage measured at the third time and the fourth node voltage measured at the fourth time, a second resistance value for the one or more electrical components electrically connecting the first node and the second node; and determine an averaged resistance value using the first resistance value and the second resistance value.

Clause 8. The controller circuit of clauses 1-7, wherein the controller circuit is configured to determine whether aging has occurred on the one or more electrical components using the resistance value.

Clause 9. The controller circuit of clause 8, wherein the first time and the second time occur within a first time range and wherein, to determine whether aging has occurred on the one or more electrical components, the controller circuit is configured to: determine a first averaged resistance value using the resistance value; and compare the first averaged resistance value with a second resistance value determined using a first node voltage node at the first node measured by the first device during a second time range and a second node voltage at a second node measured by the second device at the second time range, wherein the first time range and the second time range do not overlap.

Clause 10. The controller circuit of clauses 1-9, wherein the first node is at a pin of the first device; and wherein the second node is at a pin of the second device.

Clause 11. The controller circuit of clauses 1-10, wherein the one or more electrical components comprises one or more of: one or more printed circuit board traces; one or more wires; or one or more connectors.

Clause 12. The controller circuit of clauses 1-11, wherein the first device comprises a power distribution circuit and the second device comprises an actuator circuit; or wherein the first device comprises the actuator circuit and the second device comprises the power distribution circuit.

Clause 13. A method comprising: receiving, by a controller circuit, from a first device, a first node voltage at a first node measured by the first device at a first time when a first current flows between the first node and a second node; receiving by the controller circuit, from a second device, a second node voltage at a second node measured by the second device at a second time when a second current flows between the first node and the second node, wherein the first time is different from the second time; and responsive to determining that the first current corresponds to the second current, calculating, by the controller circuit, using the first node voltage and the second node voltage, a resistance value for one or more electrical components electrically connecting the first node and the second node.

Clause 14. The method of clause 13, wherein receiving the first node voltage comprises receiving a first indication of the first current; wherein receiving the second node voltage comprises receiving a second indication of the second current; and wherein the method further comprises determining, by the controller circuit, that the first current corresponds to the second current based on determining that a difference between the first indication of the first current received from the first device and the second indication of the second current received from the second device is less than a difference threshold.

Clause 15. The method of clause 13, wherein receiving the first node voltage comprises receiving an indication of the first current; and wherein the method further comprises determining, by the controller circuit, that the first current corresponds to the second current in response to determining that the indication of the first current received from the first device indicates that the first current is within a current threshold, wherein the second current is within the current threshold.

Clause 16. A system comprising: a first device configured to output a first node voltage measured at a first node by the first device at a first time when a first current flows between the first node and a second node; a second device configured to output a second node voltage measured at a second node by the second device at a second time when a second current flows between the first node and the second node, wherein the first time is different from the second time; and a controller circuit configured to, responsive to a determination that the first current corresponds to the second current, calculate, using the first node voltage and the second node voltage, a resistance value for one or more electrical components electrically connecting the first node and the second node.

Clause 17. The system of clause 16, wherein the first device is configured to output a first indication of the first current; wherein the second device is configured to output a second indication of the second current; and wherein the controller circuit is configured to determine that the first current corresponds to the second current based on a determination that a difference between the first indication of the first current received from the first device and the second indication of the second current received from the second device is less than a difference threshold.

Clause 18. The system of clause 16, wherein the first device is configured to output an indication of the first current; wherein the second device is configured to output the second node voltage when the second current is within a current threshold; wherein the controller circuit is configured to determine that the first current corresponds to the second current in response to a determination that the indication of the first current received from the first device indicates that the first current is within the current threshold.

Clause 19. The system of clause 18, wherein the second device comprises a comparator configured to output the second node voltage when the second current is within the current threshold.

Clause 20. The system of clause 16, wherein the first device is configured to output the first node voltage when the first current is within a current threshold; wherein the second device is configured to output the second node voltage when the second current is within the current threshold; wherein the controller circuit is configured to determine that the first current corresponds to the second current in response to the first device being configured to output the first node voltage when the first current is within the current threshold and the second device being configured to output the second node voltage when the second current is within the current threshold.

Clause 21. The system of clause 20, wherein one or more of: the first device comprises a first comparator configured to output the first node voltage when the first current is within the current threshold; or the second device comprises a second comparator configured to output the second node voltage when the second current is within the current threshold.

Clause 22. The system of clauses 20-21, wherein, to calculate the resistance value, the controller circuit is configured to: determine a difference between the first node voltage and the second node voltage; and divide the difference by a current value that is within the current threshold.

Clause 23. The controller circuit of clauses 20-22, wherein the resistance value is a first resistance value; wherein the first device is further configured to output a third node voltage measured at the first node by the first device at a third time when a third current flows between the first node and a second node; wherein the second device is configured to output a fourth node voltage measured at the second node by the second device at a fourth time when a fourth current flows between the first node and a second node, wherein the third time and the fourth time are different; and wherein the controller circuit is configured to calculate, using the third node voltage measured at the third time and the fourth node voltage measured at the fourth time, a second resistance value for the one or more electrical components electrically connecting the first node and the second node; and determine an averaged resistance value using the first resistance value and the second resistance value.

Various aspects have been described in this disclosure. These and other aspects are within the scope of the following claims.

The invention claimed is:

1. A controller circuit comprising processing circuitry, the processing circuitry configured to:
   receive, from a first device, a first node voltage measured at a first node by the first device at a first time when a first current flows between the first node and a second node;
   receive, from a second device, a second node voltage measured at the second node by the second device at a second time when a second current flows between the first node and the second node, wherein the first time is different from the second time; and
   responsive to a determination that the first current corresponds to the second current, calculate, using the first node voltage and the second node voltage, a resistance value for one or more electrical components electrically connecting the first node and the second node.

2. The controller circuit of claim 1,
   wherein, to receive, the first node voltage, the processing circuitry circuit is configured to receive a first indication of the first current;
   wherein, to receive, the second node voltage, the processing circuitry is configured to receive a second indication of the second current; and
   wherein the processing circuitry is configured to determine that the first current corresponds to the second current based on a determination that a difference between the first indication of the first current received from the first device and the second indication of the second current received from the second device is less than a difference threshold.

3. The controller circuit of claim 2, wherein, to calculate the resistance value, the processing circuitry is configured to:
    determine a difference between the first node voltage and the second node voltage;
    determine an average value of the first current and the second current; and
    divide the difference by the average value.

4. The controller circuit of claim 2, wherein the resistance value is a first resistance value and wherein the processing circuitry is configured to:
    receive a third node voltage measured at the first node by the first device at a third time when a third current flows between the first node and the second node and a third indication of the third current;
    receive a fourth node voltage measured at the second node by the second device at a fourth time when a fourth current flows between the first node and the second node and a fourth indication of the fourth current, wherein the third time and the fourth time are different;
    responsive to a determination that a difference between the third indication of the third current received from the first device and the fourth indication of the fourth current received from the second device is less than the difference threshold, calculate, using the third node voltage measured at the third time and the fourth node voltage measured at the fourth time, a second resistance value for the one or more electrical components electrically connecting the first node and the second node; and
    determine an averaged resistance value using the first resistance value and the second resistance value.

5. The controller circuit of claim 1,
    wherein, to receive the first node voltage, the processing circuitry is configured to receive an indication of the first current; and
    wherein the processing circuitry is configured to determine that the first current corresponds to the second current in response to a determination that the indication of the first current received from the first device indicates that the first current is within a current threshold, wherein the second current is within the current threshold.

6. The controller circuit of claim 5, wherein, to calculate the resistance value, the processing circuitry is configured to:
    determine a difference between the first node voltage and the second node voltage;
    determine an average value of the first current and the current threshold; and
    divide the difference by the average value.

7. The controller circuit of claim 5, wherein the resistance value is a first resistance value and wherein the processing circuitry is configured to:
    receive a third node voltage measured at the first node by the first device at a third time when a third current flows between the first node and the second node and an indication of the third current;
    receive a fourth node voltage measured at the second node by the second device at a fourth time when a fourth current flows between the first node and the second node, wherein the third time and the fourth time are different;
    responsive to a determination that the indication of the third current received from the first device indicates that the third current is within the current threshold, calculate, using the third node voltage measured at the third time and the fourth node voltage measured at the fourth time, a second resistance value for the one or more electrical components electrically connecting the first node and the second node; and
    determine an averaged resistance value using the first resistance value and the second resistance value.

8. The controller circuit of claim 1, wherein the processing circuitry is configured to determine whether aging has occurred on the one or more electrical components using the resistance value.

9. The controller circuit of claim 8, wherein the first time and the second time occur within a first time range and wherein, to determine whether aging has occurred on the one or more electrical components, the processing circuitry is configured to:
    determine a first averaged resistance value using the resistance value; and
    compare the first averaged resistance value with a second resistance value determined using a first node voltage node at the first node measured by the first device during a second time range and a second node voltage at the second node measured by the second device at the second time range, wherein the first time range and the second time range do not overlap.

10. The controller circuit of claim 1,
    wherein the first node is at a pin of the first device; and
    wherein the second node is at a pin of the second device.

11. The controller circuit of claim 1, wherein the one or more electrical components comprises one or more of:
    one or more printed circuit board traces;
    one or more wires; or
    one or more connectors.

12. The controller circuit of claim 1,
    wherein the first device comprises a power distribution circuit and the second device comprises an actuator circuit; or
    wherein the first device comprises the actuator circuit and the second device comprises the power distribution circuit.

13. A method comprising:
    receiving, by a controller circuit, from a first device, a first node voltage at a first node measured by the first device at a first time when a first current flows between the first node and a second node;
    receiving, by the controller circuit, from a second device, a second node voltage at the second node measured by the second device at a second time when a second current flows between the first node and the second node, wherein the first time is different from the second time; and
    responsive to determining that the first current corresponds to the second current, calculating, by the controller circuit, using the first node voltage and the second node voltage, a resistance value for one or more electrical components electrically connecting the first node and the second node.

14. The method of claim 13,
    wherein receiving the first node voltage comprises receiving a first indication of the first current;
    wherein receiving the second node voltage comprises receiving a second indication of the second current; and
    wherein the method further comprises determining, by the controller circuit, that the first current corresponds to the second current based on determining that a difference between the first indication of the first current received from the first device and the second indication of the second current received from the second device is less than a difference threshold.

15. The method of claim 13,
wherein receiving the first node voltage comprises receiving an indication of the first current; and
wherein the method further comprises determining, by the controller circuit, that the first current corresponds to the second current in response to determining that the indication of the first current received from the first device indicates that the first current is within a current threshold, wherein the second current is within the current threshold.

16. A system comprising:
a first device configured to output a first node voltage measured at a first node by the first device at a first time when a first current flows between the first node and a second node;
a second device configured to output a second node voltage measured at the second node by the second device at a second time when a second current flows between the first node and the second node, wherein the first time is different from the second time; and
a controller circuit configured to, responsive to a determination that the first current corresponds to the second current, calculate, using the first node voltage and the second node voltage, a resistance value for one or more electrical components electrically connecting the first node and the second node.

17. The system of claim 16,
wherein the first device is configured to output a first indication of the first current;
wherein the second device is configured to output a second indication of the second current; and
wherein the controller circuit is configured to determine that the first current corresponds to the second current based on a determination that a difference between the first indication of the first current received from the first device and the second indication of the second current received from the second device is less than a difference threshold.

18. The system of claim 16,
wherein the first device is configured to output an indication of the first current;
wherein the second device is configured to output the second node voltage when the second current is within a current threshold; and
wherein the controller circuit is configured to determine that the first current corresponds to the second current in response to a determination that the indication of the first current received from the first device indicates that the first current is within the current threshold.

19. The system of claim 18, wherein the second device comprises a comparator configured to output the second node voltage when the second current is within the current threshold.

20. The system of claim 16,
wherein the first device is configured to output the first node voltage when the first current is within a current threshold;
wherein the second device is configured to output the second node voltage when the second current is within the current threshold; and
wherein the controller circuit is configured to determine that the first current corresponds to the second current in response to the first device being configured to output the first node voltage when the first current is within the current threshold and the second device being configured to output the second node voltage when the second current is within the current threshold.

21. The system of claim 20, wherein one or more of:
the first device comprises a first comparator configured to output the first node voltage when the first current is within the current threshold; or
the second device comprises a second comparator configured to output the second node voltage when the second current is within the current threshold.

22. The system of claim 20, wherein, to calculate the resistance value, the controller circuit is configured to:
determine a difference between the first node voltage and the second node voltage; and
divide the difference by a current value that is within the current threshold.

23. The system of claim 20,
wherein the resistance value is a first resistance value;
wherein the first device is further configured to output a third node voltage measured at the first node by the first device at a third time when a third current flows between the first node and a second node;
wherein the second device is configured to output a fourth node voltage measured at the second node by the second device at a fourth time when a fourth current flows between the first node and the second node, wherein the third time and the fourth time are different; and
wherein the controller circuit is configured to calculate, using the third node voltage measured at the third time and the fourth node voltage measured at the fourth time, a second resistance value for the one or more electrical components electrically connecting the first node and the second node; and
determine an averaged resistance value using the first resistance value and the second resistance value.

* * * * *